United States Patent
Rudmann et al.

(10) Patent No.: US 8,221,665 B2
(45) Date of Patent: Jul. 17, 2012

(54) MANUFACTURING A REPLICATION TOOL, SUB-MASTER OR REPLICA

(75) Inventors: Hartmut Rudmann, Unterlunkhofen (CH); Andreas Maciossek, Zurich (CH); Markus Rossi, Jona (CH)

(73) Assignee: Heptagon Oy, Espoo (FI)

( * ) Notice: Subject to any disclaimer, the term of this patent is extended or adjusted under 35 U.S.C. 154(b) by 783 days.

(21) Appl. No.: 11/423,318

(22) Filed: Jun. 9, 2006

(65) Prior Publication Data
US 2006/0259546 A1 Nov. 16, 2006

Related U.S. Application Data

(63) Continuation-in-part of application No. PCT/CH2004/000736, filed on Dec. 13, 2004.

(30) Foreign Application Priority Data

Dec. 11, 2003 (EP) .................................. 03405888

(51) Int. Cl.
*G11B 7/26* (2006.01)

(52) U.S. Cl. ......... 264/227; 264/2.5; 264/220; 264/225; 264/226; 264/313; 425/383; 425/808

(58) Field of Classification Search .................. 264/220, 264/225, 226, 227, 1.1, 1.32, 1.33, 1.4, 2.5, 264/157, 160, 264, 299, 313; 425/383, 385, 425/808
See application file for complete search history.

(56) References Cited

U.S. PATENT DOCUMENTS

| | | | | |
|---|---|---|---|---|
| 3,565,978 A | * | 2/1971 | Folger et al. | 264/1.34 |
| 3,767,445 A | * | 10/1973 | Chandross et al. | 427/510 |
| 4,197,266 A | * | 4/1980 | Clark et al. | 264/2.2 |
| 4,729,938 A | * | 3/1988 | Tajima et al. | 430/270.11 |
| 5,141,677 A | * | 8/1992 | Fogarty | 264/1.36 |
| 5,174,937 A | * | 12/1992 | Tamura et al. | 264/106 |
| 5,259,926 A | * | 11/1993 | Kuwabara et al. | 216/54 |
| 5,330,880 A | * | 7/1994 | Horigome et al. | 430/321 |
| 5,458,985 A | * | 10/1995 | Isono et al. | 428/601 |
| 5,512,131 A | * | 4/1996 | Kumar et al. | 438/738 |
| 5,516,469 A | * | 5/1996 | Santoh et al. | 264/1.33 |
| 5,536,455 A | * | 7/1996 | Aoyama et al. | 264/1.7 |

(Continued)

FOREIGN PATENT DOCUMENTS

WO 99/18612 4/1999

(Continued)

OTHER PUBLICATIONS

Xia, Younan and Whitesdies, George M; "Soft Lithography"; Angew. Chem. Int., vol. 37, 1998, pp. 551-575, XP000985399.

*Primary Examiner* — Joseph Del Sole
*Assistant Examiner* — Seyed Masoud Malekzadeh
(74) *Attorney, Agent, or Firm* — Rankin, Hill & Clark LLP

(57) ABSTRACT

The invention concerns a process of manufacturing optical components. A replication tool, a sub-master or a replica is manufactured using a structured element (for example a master) and a substrate. A structure of the structured element is replicated into liquid or plastically deformable material disposed at a first place on said substrate, then hardened to make it dimensionally stable, whereon the structured element is removed. These replicating, hardening and removing steps are repeated for a second, third, etc. place on said substrate the same structured element.

14 Claims, 8 Drawing Sheets

U.S. PATENT DOCUMENTS

| | | | | |
|---|---|---|---|---|
| 5,586,109 | A * | 12/1996 | Inui et al. | 369/277 |
| 5,597,613 | A * | 1/1997 | Galarneau et al. | 427/162 |
| 5,635,114 | A * | 6/1997 | Hong | 264/1.33 |
| 5,688,447 | A * | 11/1997 | Hong | 264/1.33 |
| 5,783,371 | A * | 7/1998 | Bifano | 430/321 |
| 5,843,626 | A * | 12/1998 | Ohta et al. | 430/320 |
| 5,900,160 | A * | 5/1999 | Whitesides et al. | 216/41 |
| 5,930,041 | A * | 7/1999 | Thielman | 359/530 |
| 6,190,838 | B1 * | 2/2001 | Kerfeld | 430/320 |
| 6,284,072 | B1 * | 9/2001 | Ryan et al. | 156/59 |
| 6,297,911 | B1 * | 10/2001 | Nishikawa et al. | 359/619 |
| 6,335,198 | B1 * | 1/2002 | delCardayre et al. | 435/440 |
| 6,354,827 | B1 * | 3/2002 | Kerfeld | 425/195 |
| 6,355,198 | B1 * | 3/2002 | Kim et al. | 264/259 |
| 6,365,329 | B2 * | 4/2002 | Kerfeld | 430/321 |
| 6,375,870 | B1 * | 4/2002 | Visovsky et al. | 264/1.31 |
| 6,501,534 | B1 * | 12/2002 | Singh et al. | 355/55 |
| 6,517,995 | B1 * | 2/2003 | Jacobson et al. | 430/320 |
| 6,638,692 | B1 * | 10/2003 | Banal et al. | 430/320 |
| 6,645,432 | B1 * | 11/2003 | Anderson et al. | 422/502 |
| 6,776,094 | B1 * | 8/2004 | Whitesides et al. | 101/327 |
| 6,805,902 | B1 * | 10/2004 | Hayes | 427/162 |
| 6,818,139 | B1 * | 11/2004 | Lee et al. | 216/49 |
| 6,820,769 | B2 * | 11/2004 | Foster et al. | 222/153.13 |
| 6,876,051 | B2 * | 4/2005 | Ushijima et al. | 257/432 |
| 6,890,704 | B2 * | 5/2005 | Edwards | 430/321 |
| 6,893,850 | B2 * | 5/2005 | Ostuni et al. | 435/174 |
| 6,936,181 | B2 * | 8/2005 | Bulthaup et al. | 216/44 |
| 6,972,844 | B2 * | 12/2005 | Tokita | 356/401 |
| 7,098,988 | B2 * | 8/2006 | Chae et al. | 349/155 |
| 7,100,263 | B2 * | 9/2006 | Imada et al. | 29/514 |
| 7,160,649 | B2 * | 1/2007 | Lizotte | 430/5 |
| 7,211,209 | B2 * | 5/2007 | Kim et al. | 264/129 |
| 7,267,938 | B2 * | 9/2007 | Anderson et al. | 435/4 |
| 7,442,336 | B2 * | 10/2008 | Choi et al. | 264/496 |
| 7,445,742 | B2 * | 11/2008 | Chen et al. | 264/293 |
| 7,470,386 | B2 * | 12/2008 | Kang et al. | 264/227 |
| 2001/0000745 | A1 * | 5/2001 | Kerfeld | 430/320 |
| 2001/0036602 | A1 * | 11/2001 | McGrew et al. | 430/321 |
| 2001/0054778 | A1 * | 12/2001 | Unger et al. | 264/239 |
| 2002/0092962 | A1 * | 7/2002 | Domeier et al. | 249/60 |
| 2002/0118465 | A1 * | 8/2002 | Hosoe | 359/642 |
| 2002/0141062 | A1 * | 10/2002 | Christoffersen et al. | 359/566 |
| 2002/0142114 | A1 * | 10/2002 | Mizuno et al. | 428/34.3 |
| 2003/0010431 | A1 * | 1/2003 | Feldman et al. | 156/250 |
| 2003/0017424 | A1 | 1/2003 | Park et al. | |
| 2003/0030184 | A1 * | 2/2003 | Kim et al. | 264/325 |
| 2003/0047822 | A1 * | 3/2003 | Hori et al. | 264/1.21 |
| 2003/0071016 | A1 * | 4/2003 | Shih et al. | 216/54 |
| 2003/0179687 | A1 * | 9/2003 | Schoeppel et al. | 369/273 |
| 2004/0009413 | A1 * | 1/2004 | Lizotte | 430/5 |
| 2004/0036201 | A1 * | 2/2004 | Chou et al. | 264/402 |
| 2004/0135293 | A1 * | 7/2004 | Umeki | 264/494 |
| 2004/0192041 | A1 * | 9/2004 | Jeong et al. | 438/689 |
| 2004/0244421 | A1 * | 12/2004 | Kato et al. | 65/26 |
| 2005/0018595 | A1 * | 1/2005 | Conroy et al. | 369/288 |
| 2005/0037916 | A1 * | 2/2005 | Chen et al. | 502/101 |
| 2005/0057705 | A1 * | 3/2005 | Yamanaka et al. | 349/95 |
| 2005/0159019 | A1 * | 7/2005 | Lee | 438/800 |
| 2006/0113701 | A1 * | 6/2006 | Rudmann et al. | 264/219 |
| 2006/0279025 | A1 * | 12/2006 | Heidari et al. | 264/496 |
| 2008/0230934 | A1 * | 9/2008 | Rudmann et al. | 264/2.7 |

FOREIGN PATENT DOCUMENTS

| | | |
|---|---|---|
| WO | 00/65408 | 11/2000 |
| WO | 01/20402 | 3/2001 |

* cited by examiner

MANUFACTURING A REPLICATION TOOL, SUB-MASTER OR REPLICA

This application is a continuation-in-part of International Application PCT/CH2004/000736, with an international filing date of Dec. 13, 2004, currently pending, which claims priority from European Patent Application 03 405 888.3 filed on Dec. 11, 2003.

BACKGROUND OF THE INVENTION

1. Field of the Invention

The present invention is in the field of manufacturing micro-optical, micro-mechanical or micro-fluidic components or elements. It more specifically relates to a method of manufacturing a replication-tool, sub-master or replica.

2. Description of Related Art

Micro-optical and micro-mechanical components are industrially mass-produced by various technologies, such as injection molding, roller hot embossing, flat-bed hot embossing, UV embossing (all these processes being replication processes) or lithography and etching processes. As an example, in the UV embossing process the surface topology of a master structure is duplicated into a thin film of a UV-curable epoxy resin on top of a substrate. In the case of micro-optics, the surface topology can be a refractive or a diffractive structure, or a combination of both. For that purpose, a tool (negative copy) is prepared from the master, which is then used to UV-emboss the epoxy resin. The substrate typically consists of a standard glass wafer, a high-precision machined refractive optical element or a wafer of opto-electronic components. The master can be a lithographically fabricated structure in fused silica or silicon, a laser or e-beam written microstructure or any other type of optical or mechanical microstructure. The component consisting of the substrate and epoxy layer is typically referred to as replica.

To achieve a cost effective mass production of replicated micro-optical components, a wafer-scale embossing process would be desirable. A 'wafer' in the meaning used in this text is a disc or a rectangular plate of any form stable, often transparent material. The diameter of the disk is typically between 5 cm and 40 cm, for example between 10 cm and 31 cm. Often it is cylindrical with a diameter of either 2, 4, 6, 8 or 12 inches. The wafer thickness is, for example, between 0.2 mm and 10 mm, typically between 0.4 mm and 6 mm. The wafer-scale replication allows the fabrication of several hundred identical structures with a single step, e.g. a single or double-sided UV-embossing process. The subsequent dicing step of the wafer then yields the individual micro-optical components. For an efficient wafer-scale replication technology a wafer-scale tool and consequently a wafer-scale master or submaster is required. However, in many cases it is either not possible or very costly to produce a master that covers a sufficiently large area (typically at least 4-6 inches). For instance, mastering techniques such as e-beam writing typically cover only a small area in the range of several square mm which is only the size of an individual micro-optical component. Therefore, a process is required that closes the gap between the size of the individual component to the full wafer scale.

BRIEF SUMMARY OF THE INVENTION

It is an object of this invention to provide a method of manufacturing a replication tool, a sub-master or a replica in a method of manufacturing micro-optical or micro-mechanical components by replication, the method supporting large scale replication, for example wafer-scale replication. Preferably, the method should be economical, and should be readily implementable using means that as such are known.

In accordance with a first aspect of the invention, in a process of manufacturing optical components, an element that includes a plurality of replicated structures (such as a wafer-scale element) is provided, each comprising geometrical features of at least one optical component, the method comprising the steps of providing a master or a master tool having a structured surface,
  performing a first replication step to replicate a first stage cast from the master or master tool,
  performing a second replication step to replicate a second stage cast from the first stage cast,
  performing a third replication step to replicate a third stage cast from the second stage cast
  each replication step including the sub-steps of
  providing liquid or viscous or plastically deformable material,
  replicating a structured surface of an element to be replicated (for example the master or sub-master or a cast) into the liquid or viscous or plastically deformable material, and
  hardening the liquid or viscous or plastically deformable material to form a structured surface of a replicated element (the first, second, third, potentially fourth, . . . ) stage cast,
  wherein at least one of the replication steps includes
  providing a substrate,
  replicating the structured surface into the liquid or plastically deformable material disposed at a first place on the substrate,
  hardening the material,
  removing the element to be replicated,
  replicating the structured surface of the same element into the liquid or plastically deformable material at a second place on the substrate,
  hardening the material, and
  removing the element to be replicated,
whereby the replicated element comprises a plurality of replicated structures, each being a cast of the structured surface.

Thus, in the complete production chain of the wafer-scale replication, a so-called "generation process" is being used. A generation includes the fabrication of a cast of a master (or master tool) and the subsequent fabrication of a further cast from the cast, for example the fabrication of at least one replication tool from the master and the subsequent fabrication of a number of sub-masters. For an industrial production, typically second or third generation replicas are being produced. The major reason to introduce a generation process is to protect the expensive original master. Since the replication tools have a limited lifetime, many tooling operations can be required. Each tooling operation, be it a galvanic or a casting step, has the risk to either leave some residues on the master or to even damage it.

According to a second aspect of the invention, a structured element is replicated into liquid or plastically deformable material dispensed in a trough of a recombination framework on a surface of the substrate, preferably forming a regular grid or lattice. Then, the material is hardened to make it dimensionally stable. Afterwards, the (micro-) structured element is removed, and the replicating, the hardening and the removing steps are repeated, preferably many times, using the same (micro-) structured element for a second, third, . . . trough on the substrate.

The spaces framed by the grid are called "troughs" in this document. The term "trough" does not indicate that the structures have a particular depth in relation to their widths or that the grid is uninterrupted so that the troughs could contain a liquid (not accounting for surface tension), but merely indicates the spacings framed by the framework. The troughs may roughly have the dimensions of the active area of the microstructured element, whereas the structured element's size is often greater than the area of the trough, so that the structured element may abut the framework during the replication step, so that a framework's upper level defines a z position of the structured element during the recombination process. In this way, the thickness of the tool, sub-master or replica may be a well-defined quantity if desired.

Troughs in general are structures that comprise walls that essentially (with the exception of potential channels of defined width) surround a region, i.e. that are not completely open to any side. Therefore, the recombination framework, next to potentially being useful for providing a lateral alignment of the structured element, also offers a control of the volume of the replication material (the plastically deformable or liquid material). This is due to the fact that the troughs defined by the framework forming through walls do not comprise position information, but also are a kind of 'vessel' for the recombination material. The volume control may help to be able to provide a sufficient planarity as explained further below. Further, the trough walls reliably prevent replication material from flowing to regions where replication has already taken place.

During the step and repeat process, the small size master structure is replicated into troughs and channels that are placed in a lattice like arrangement on the master substrate. The lattice like arrangement is beneficial in case of subsequent automated dicing of the final replica into the individual components.

The recombination framework may comprise, on the surface of the substrate, a grid or lattice of, for example structured photoresist material or may be a structure being replicated into material disposed on the substrate surface, for example of UV curable epoxy, thermo-curable material etc.

The recombination framework may be made of several types of troughs, each for a special type of embossing structure.

The recombination framework may further comprise channels, interrupting the trough walls, for supporting the release of trapped air in a trough during the replicating step and for acting as a reservoir for excess liquid or plastically deformable material. The recombination framework may, again optionally, further comprise a 3D structure at the bottom of the troughs to optimize the flow of the liquid or plastically deformable material during the replicating step and to minimize unneeded material being collected in certain regions.

In contrast to holographic recombination, according to the invention, any replication process is supported. Further, the method according to the invention is beneficial in view of the complete fabrication chain of high-volume production of micro-structured elements.

The term recombination as used in this document can also mean that optical microstructures of different mastering technologies are combined side by side on a wafer scale substrate in a desired arrangement.

The points addressed by embodiments of the invention include:
Profile fidelity (for feature sizes down to 100 nm and aspect ratios of up to 2:1 or higher),
Planarity and stability of the recombined tool, sub-master or replica: In most of the wafer-scale replication processes, such as UV-embossing, it is of major importance that the replication tool has a flatness of some micrometers and that the tool has a well defined upper surface, i.e. does not contain any structures protruding above a plane defined by the outermost tool features. In order to achieve these requirements for the replication tool, all elements further above in a generation process have to fulfill this condition. The present invention offers a solution by providing a plurality of cells, into each of which the same structured element is replicated. Especially, by providing a stop face for a structured element, the lateral dimensions of which exceeds the ones of a trough, the condition of the well defined z position is fulfilled and the absence of any protruding features is achieved.
Flexibility: Due to the above, the method according to the invention may be applied for a wide range of different structures.

Elements, for example, fabricated using the method according to the invention are optical elements, for example micro-optical elements. Micro-optics, as compared to conventional optics, is based on fine structures causing refraction and/or diffraction, the structures having characteristic depths/heights and often also widths of typically a few micrometers ($\mu m$), for example of 0.1 $\mu m$-200 $\mu m$, of 0.2 $\mu m$-200 $\mu m$ or of 0.5 $\mu m$-200 $\mu m$, preferably of between 0.2 $\mu m$ or 0.5 $\mu m$ and about 50 $\mu m$, often between 0.5 $\mu m$ and about 30 $\mu m$. In other words, the characteristic profile depths and the profile widths are of the order of a few wavelengths up to a few tens of wavelengths for refractive micro-optics and of about one wavelength up to a few wavelengths for diffractive optics. As a rule of thumb, micro-optical elements have structures such that the phase relation of radiation present at different neighboring places on the structure is well-defined. This is opposed to classical, purely refractive optical elements, where the behavior of the radiation at different elements of the structure can be described in a geometrical optics picture. Micro-optical elements, thus, as opposed to classical optical elements (such as classical lenses, mirror elements etc.) can be regarded as having structures which are such that the wave nature of the light has to be taken into account and participates in the effect the micro-optical element has upon radiation. Micro-optics in general is an extension to classical optics; the use of elements, the effect of which can be described by classical optics, in combination with the concept of this invention, is not excluded, Diffractive optical elements (DOEs) are an example of micro-optical elements; often micro-optical elements with primarily diffractive effect are called DOEs even if they also have some refractive effect.

In the following, the so-called UV-replication process is described as an example for which this invention is of significant benefit. However, this invention is not limited to the UV-replication. UV-curable epoxy resins are the most commonly used materials; however, this invention also applies for other types of UV or thermal curing materials and material systems. In the case of micro-optics the surface topology can be a refractive or a diffractive structure, or a combination of both. For that purpose, a tool (negative copy) is prepared from the master, which is then used to UV-emboss the epoxy resin. The substrate typically consists of a standard glass wafer, a high-precision machined refractive optical element or a wafer of opto-electronic components. The master can be a lithographically fabricated structure in fused silica, a laser or e-beam written microstructure or any other type of optical or mechanical microstructure. The component consisting of the substrate and epoxy layer is typically referred to as replica.

The first and the second aspects may be combined. As an alternative, the first aspect may be combined with a method including the steps of providing an element substrate,
replicating, by embossing, a surface of a tool element, which surface comprises a negative copy of the geometrical surface feature, into replication material disposed at a first place on a surface of the element substrate,
subsequently hardening the replication material,
replicating the surface of the tool element into replication material disposed at a second place on the substrate,
subsequently hardening the replication material,
the method including the further step of
subsequently filling a gap between replication material disposed at the first place and replication material disposed at the second place by filler material.

For the sake of convenience, the dimension perpendicular to the surface of the substrate, which comprises an essentially flat surface—is denoted as "height". In actual practice, the entire arrangement may also be used in an upside down configuration or also in a configuration where the substrate surface is vertical or at an angle to the horizontal. The according direction perpendicular to the surface is denoted as the z-direction. The terms "periphery", "lateral" and "sides" relate to a direction perpendicular to the z-direction.

The filling material added in accordance with this embodiment makes, like the recombination framework, a complete control of the z-dimension of the crucial surface portions the final replica possible, even if its own thickness is not precisely controlled at all. This is because due to it the minimal thickness of the element produced may be at sections where the substrate is covered by the replication material and where the z-dimension relative to the replication section (the portion that will finally account for the desired optical properties of the optical element produced) has been defined by the replication. Such sections of minimal thickness correspond to protruding portions (spacer portions) of the tool replicated in a further replication step. They may be used to precisely define the thickness of the optical element.

In other words, this definition of the z-dimension becomes possible since the structure of the tool that protrudes the most is next to the optical structures and is defined already in the single master or master tool.

BRIEF DESCRIPTION OF THE DRAWINGS

In the following, embodiments of the invention are described with reference to schematic drawings. In the drawings.

DETAILED DESCRIPTION OF THE PREFERRED EMBODIMENTS

In this text, 'replication' is used for a process of 'casting' in a broad sense, i.e. of making a 'negative' copy of a structured portion of the element to be replicated. When the resulting element is again replicated, this leads to a 'positive' copy of the initially replicated element. In this text, elements that comprise surface parts being a negative copy of portions of the final optical element to be manufactured are called 'tools', for example 'replication tool' or 'master tool'. Elements including surface portions with a positive copy of the final element to be manufactured are called 'master', 'sub-master', or, for the final copy to be diced into the optical elements, 'final replica' or 'replica'.

Figure 1:
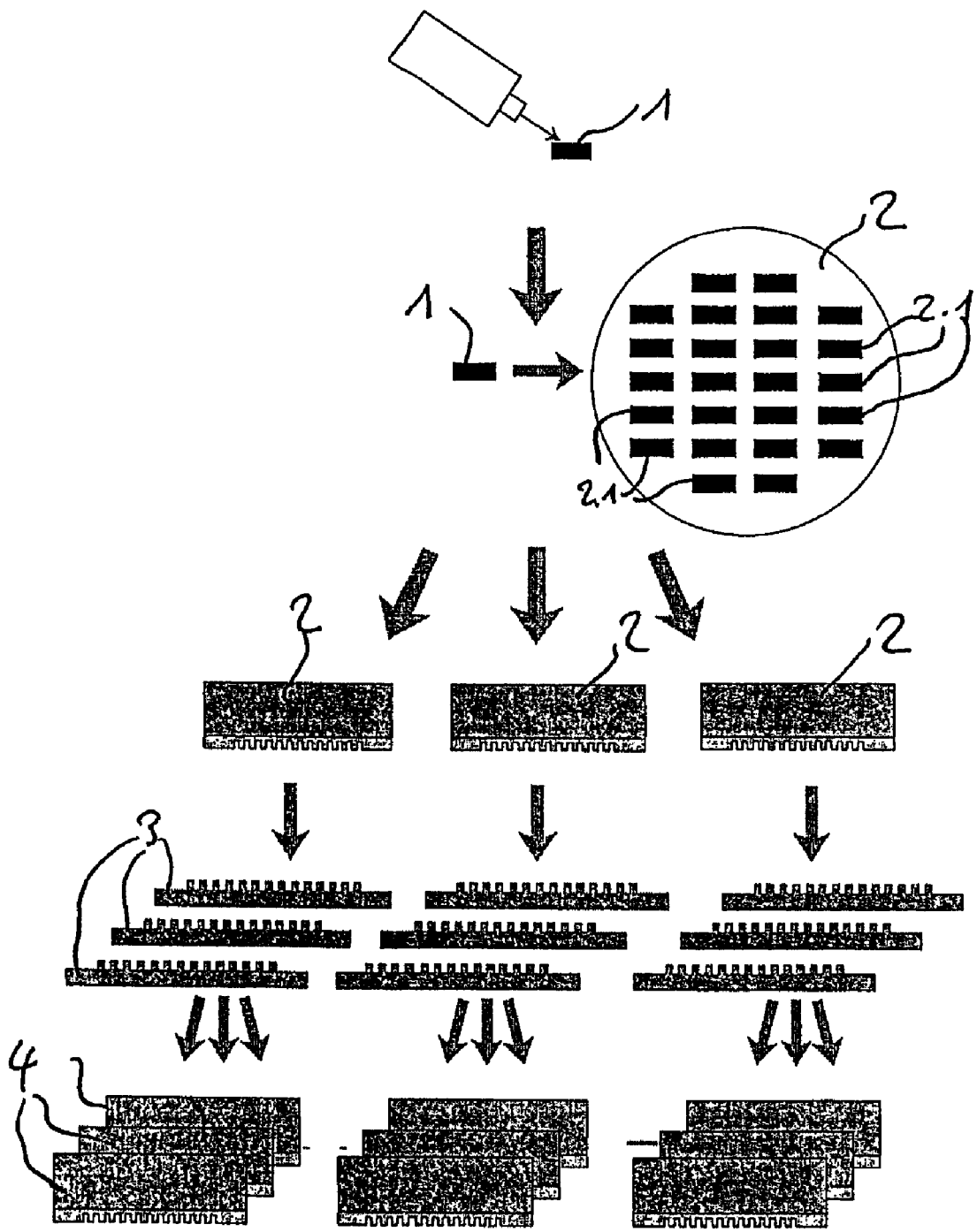
FIG. 1 shows a generation process including a recombination step.

FIG. 1 shows an example of a generation process. In a first step, a master 1 is produced by any suitable method. In the figure, a laser beam writing process is symbolized. In a recombination process, to be described in more detail further below, a first generation replication tool 2 or a plurality of first generation tools is/are manufactured. The first generation replication tool comprises a plurality of cells, each comprising an (identical) replicated structure 2.1. From each $1^{st}$ generation replication tool, a plurality of sub-masters 3 is manufactured, each comprising a plurality of cells comprising structures identical to the master's structure. From each sub-master, $2^{nd}$ generation replication tools 4 are produced which are used for manufacturing the micro-optical or micro-mechanical elements (replicas) or may be used for manufacturing next generation sub-masters. In a production process, the recombination can also be applied in a later generation, depending on the needs to preserve and protect the original structure. For example, the $1^{st}$ generation replication tools, the sub-masters or even the $2^{nd}$ generation replication tools may be small-dimension parts and comprise the structure to be replicated only once, so that the recombination process is used for producing the sub-master or the $2^{nd}$ generation replication tools, or the replica, respectively. In other words, the recombination may be applied in the $1^{st}$, $2^{nd}$ or $3^{rd}$ generation etc. Also, a scale-up generation process may be envisaged, where recombination processes may be used in more than one stage, for example by using a small size master, a medium size $1^{st}$ generation replication tool, and 'large' size sub-masters or similar.

Figure 10:
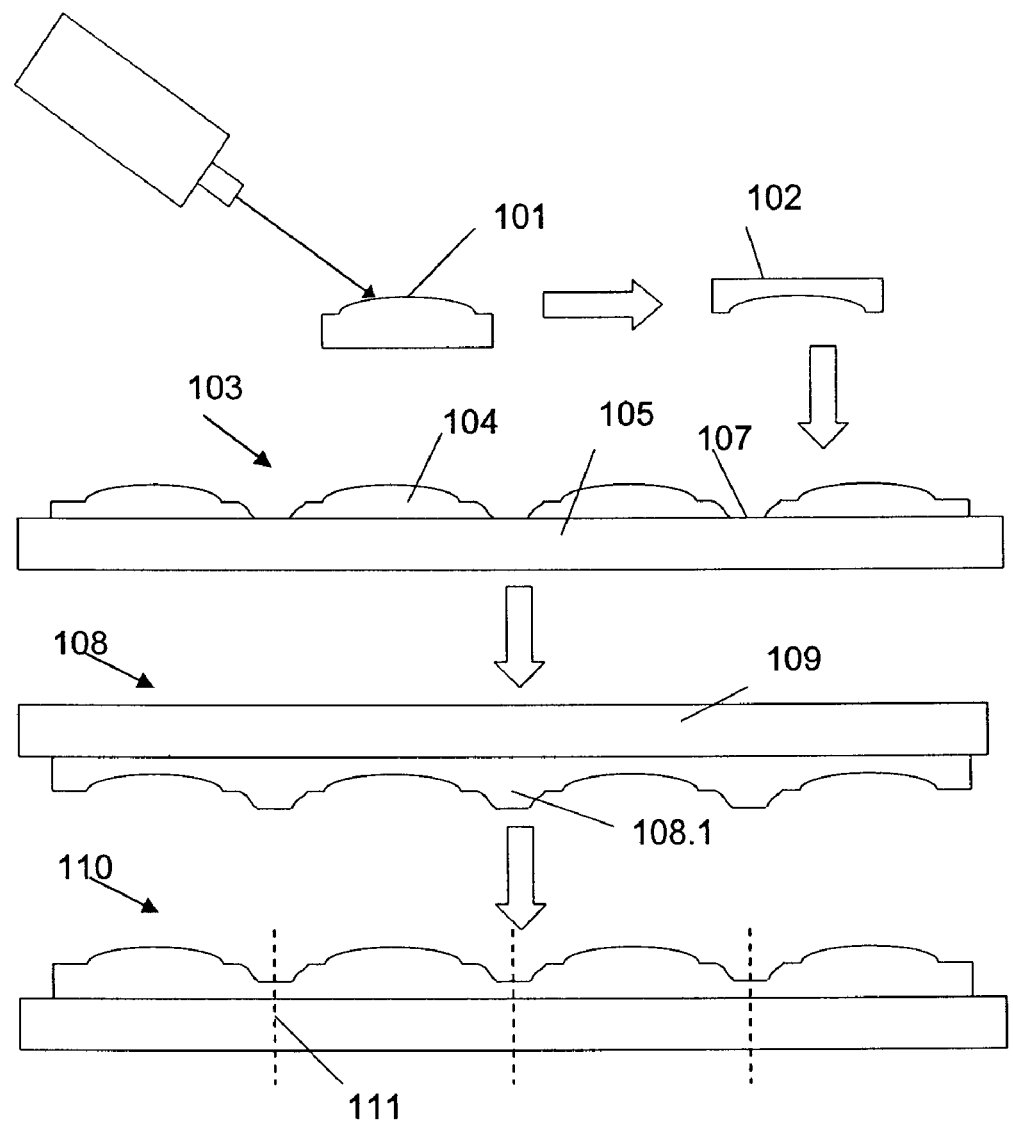
FIG. 10 shows a further embodiment of the method according to the first aspect of the invention.

An example of a generation process where the recombination step is applied at a different stage is shown in FIG. 10. There, from the small-scale master 101 a small-scale replication tool (or master tool) is cast. Thereafter, the recombination step is used to provide a sub-master 103. The sub-master includes a plurality of portions 104 of replication material disposed at different places on a substrate 105, and each comprising an identical replicated structure being a negative copy of the master tool structure. From each sub-master, $2^{nd}$ generation replication tools 108 are produced which may be used for manufacturing the final replicas 110 (wafer with the micro-optical or micro-mechanical elements to be diced; dicing lines 111) or may be used for manufacturing next generation sub-masters.

Figure 2:
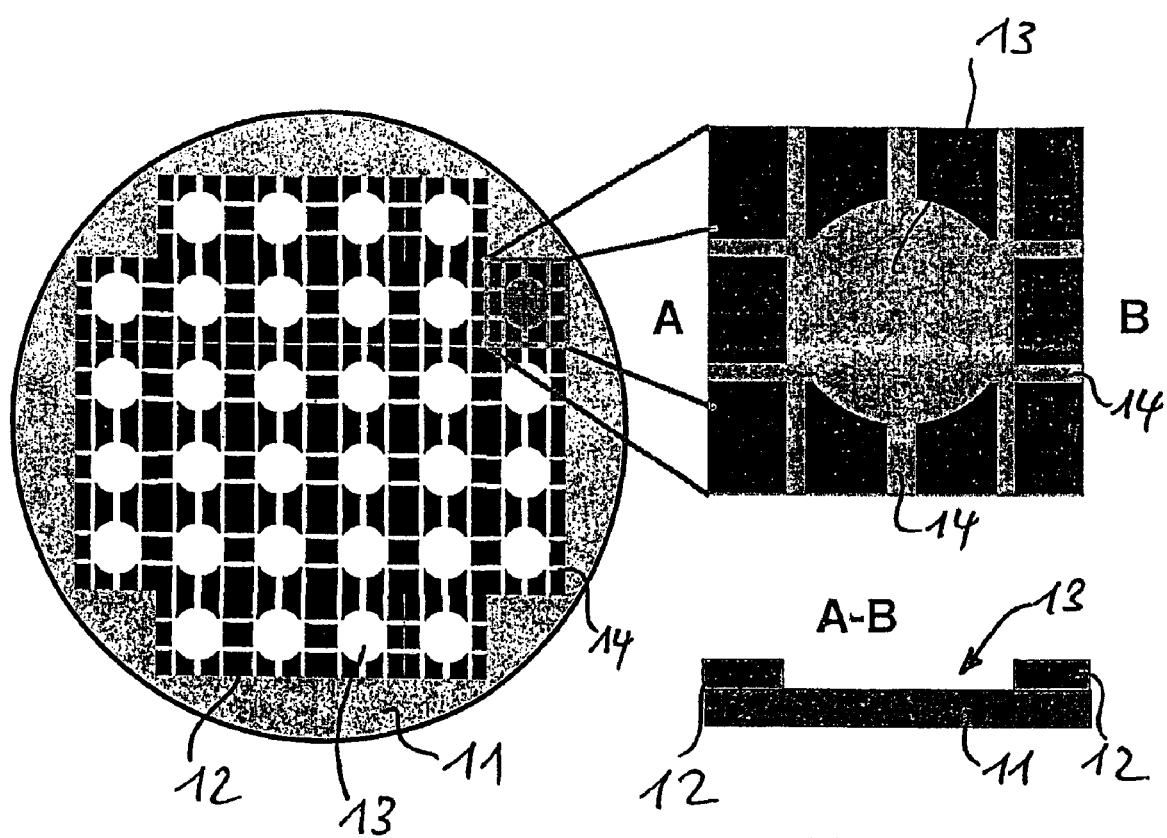
FIG. 2 represents an example of a recombination framework.

In detail, the recombination procedure in accordance with the second aspect of the invention works as follows. In a first step, a so-called "recombination framework" with troughs and channels is fabricated on the substrate. This framework has the full size of the recombined replication tool, submaster or replica to be generated and determines the positions of the individual cells. One way to fabricate such a recombination framework is by designing a photo mask and transferring the design into photo resist on top of a substrate. FIG. 2 shows an example of a wafer size substrate 11 comprising a recombination framework 12 defining a regular pattern of cells each comprising a trough 13 framed by the framework. The troughs define the area of the optical microstructures. The trough structures, with reference to the recombination framework, have to be deeper than the deepest structure that is being replicated.

Figure 7:
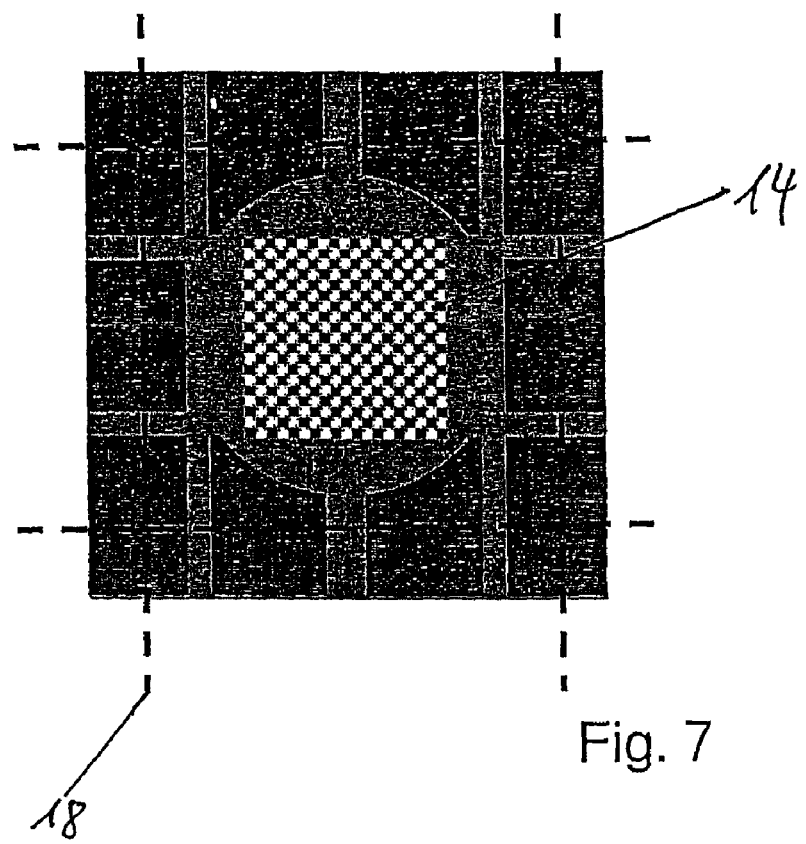
FIGS. 7-9 show several possibilities how the cells can be combined to form different types of elements.
Figure 8:
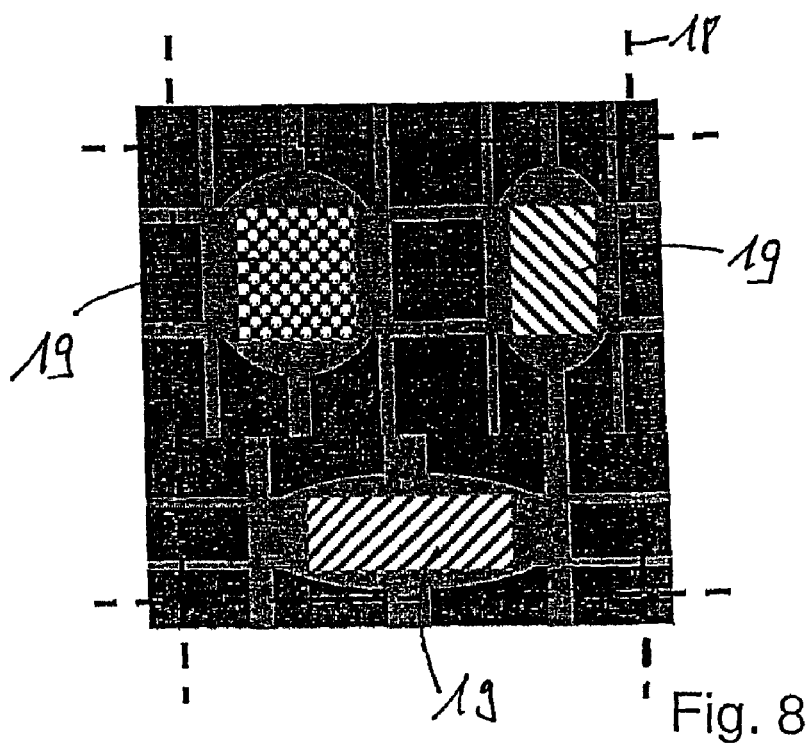
Figure 9:
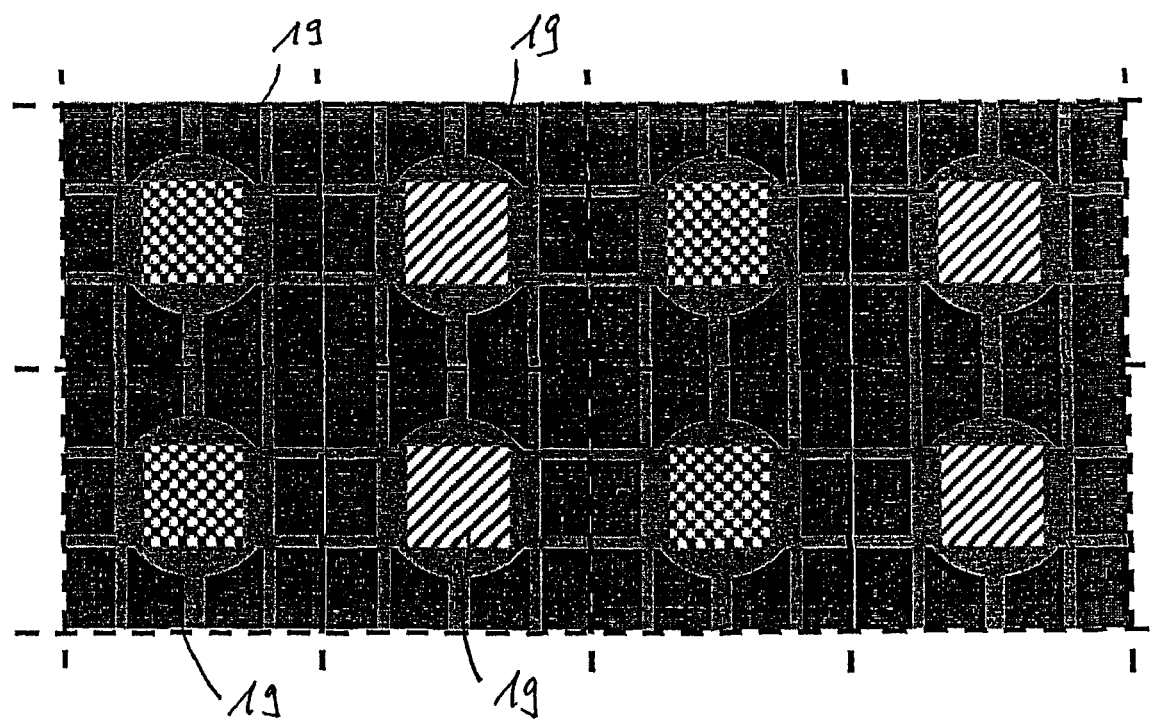

Typically, one period or cell of the recombination framework coincides with a single micro-optical or micro-mechanical element, which can be obtained by dicing or separating the plate along dicing streets 18 (cf. FIG. 7). In FIG. 7, there is one contiguous (optically) active micro-structured area 14 per cell. In the case, where several individual elements form a more complex component, one period or cell of the recombination framework can contain several identical or different sub-cells 19 (cf. FIG. 8 and FIG. 9), where each one can contain individual troughs and channels. In FIGS. 8 and 9, different types of micro-optical, micro-mechanical or micro-fluidic structures are represented by different textures. In FIG. 9, each cell comprises four sub-cells recombined in a regular arrangement. Complex components as in FIGS. 8 and 9 may require that more than one type of microstructure is used, e.g. different types of micro-optics and/or combining micro-optics with micro-mechanics. This can be achieved either by replicating different microstructures in separate troughs simultaneously or by repeating the above described process with different types of microstructures, each one used only in a defined subset of all sub-cells or troughs. The above described possibility to combine different types of microstructures by means of a replication into a pre-defined recombination frame can even be used to generate only a single component.

The possibility to generate complex opto-mechanical microsystems with this approach can also open up the requirement that not all surfaces of the final component are on the same level. This can be achieved by recombination networks that have different height levels for different types and/or positions of the individual structures.

The master 1 or other structured element comprises the structures of the micro-optical, micro-mechanical or micro-fluidic element to be fabricated, or a negative thereof. It may, as an alternative, comprise the structures of a plurality of small micro-optical elements or, in a special embodiment, even of only a part of a micro-optical element to be fabricated. The structure feature sizes may be feature sizes typical for micro-optical elements and may, for example, be smaller than 1 micrometer.

In the case of a binary framework (i.e. only two heights are defined), the thickness of the framework (for example of the photo resist layer) determines the final depth of the troughs and channels. Such a photo resist patterned glass wafer can act directly as a framework structure for the recombination. As an alternative, in an additional step, a replica of this trough and channel structure is made, which is then used as the recombination framework. Other technologies can be used to generate such a recombination framework, such as any replication (from a framework master or sub-master) or lithography technology. Any re-fabricated 2-dimensional or 3-dimensional structure may be used for the framework.

The recombination framework may further comprise channels 14. If the replication process is an embossing process, the channels have, amongst others, two major purposes. Firstly the channels support the release of trapped air in a trough during the embossing step and secondly they act as a reservoir for excess epoxy material. The latter function is important to avoid having excess material collect on top of the walls and allows the epoxy material to redistribute if the filling of the trough was not completed in some areas of the trough.

Figure 3:
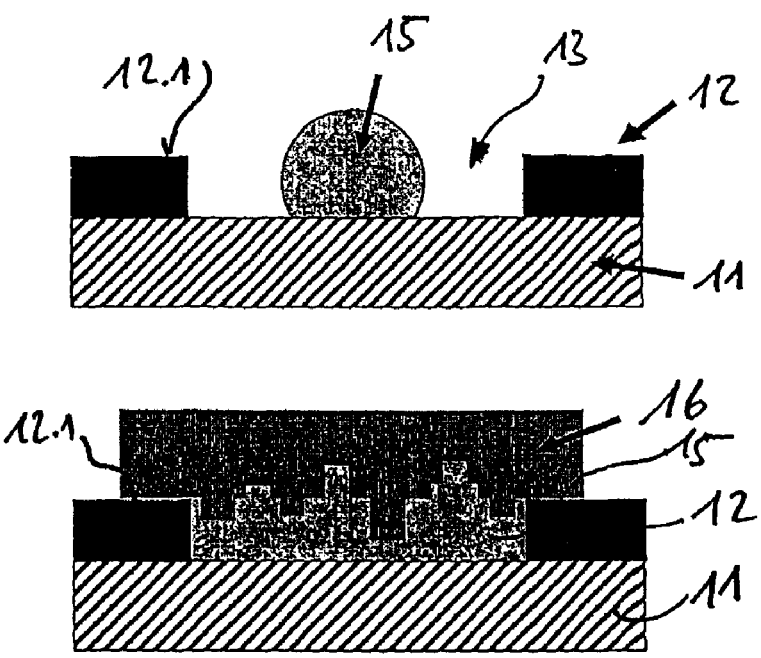
FIG. 3 represents the replication of a structure into a cell of the recombination framework.

During the recombination process, the small size master structure is replicated into each cell of the framework shown in FIG. 2. In the following, this step is described at the example of UV-embossing with reference to FIG. 3. However, the same process can also be carried out by other replication technologies such as hot embossing, embossing in thermally curing materials, injection molding, for example using the channels etc. A defined amount of replication material 15 is dispensed into the trough 13 followed by the embossing step as shown in the lower panel of FIG. 3 and then by UV curing. The structured element 16, for example being the master in a generation process, serves as an embossing tool in the embossing step. The size of the embossing tool 16 is such that it fits over the area of a single cell and can rest on the top surface 12.1 of the recombination framework, which serves as a stop face. The upper level of the walls surrounding the troughs act as base for the tool to ensure that all replicas have the same height, i.e. lay in the same plane.

Figure 4:
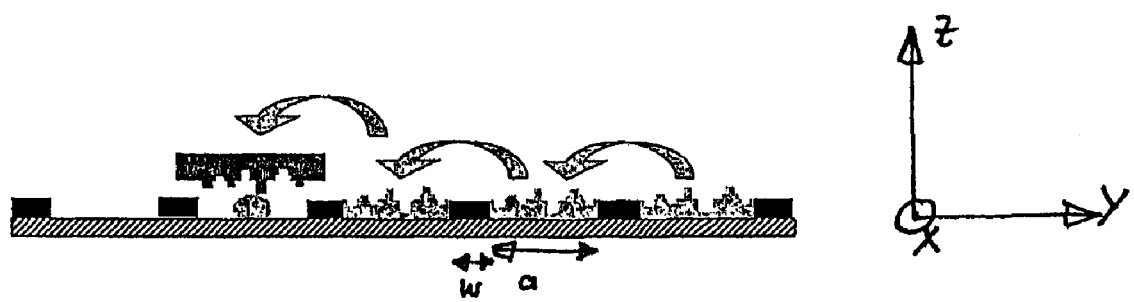
FIG. 4 shows a step- and repeat process including replication of one structure into a plurality of cells.

This embossing step into an individual trough is repeatedly done on the wafer step by step (in a lateral direction, corresponding to an X or Y direction in a coordinate system as sketched) as is shown in FIG. 4. Instead of the rectangular lattice arrangement shown in the figures, other arrangements may be chosen, such as e.g. hexagonal arrangements, other regular arrangements or even irregular arrangements.

In the shown embodiment, the replication material is placed into each trough individually before the replicating step, but after the hardening step of the previous cell. In this embodiment, no selective mechanism for hardening the material in the individual cells is required. For example if the replicating material is UV curable epoxy, a whole region of the substrate around the cell may be illuminated by a UV light source for hardening the material in the individual cell. In an alternative embodiment, the replication material may be placed in a plurality of or in all of the cells before replication starts. Then, hardening is performed selectively. This can, for example, be done using a mask allowing UV radiation only onto a particular cell. Such a mask can be coupled directly to the embossing tool. Other replication techniques also allow for selective hardening mechanisms, for example selective heating by IR illumination.

This step and repeat process yields a recombined sub-master structure of wafer scale where many (typically several hundreds) identical structures are on a lattice type arrangement, i.e. at a fixed distance in x and y direction. A regular, lattice like arrangement is beneficial because of the automated separation processes (such as dicing, punching, cutting, scribing and breaking) to fabricate the individual component. The size of an individual cell of the lattice is typically determined by the size of the final diced element a plus the width w of the dicing street. Such a wafer-size recombined master acts as the sub-master, from which a replication tool is being fabricated. This tool is then used for the subsequent wafer-scale UV embossing process.

The replication process used for recombination may be, instead of a UV-replication step, a hot embossing process, a step-and-repeat imprint or lithography/etching process, or even an injection molding step or mechanical assembly of a replicated structure into a given framework.

The fabrication of a micro-optical and micro-mechanical element comprises the steps of manufacturing a master, possibly replicating it, of manufacturing a replication tool, submaster or replica using the method according to the invention, of possibly further replicating the result in a generation process, and of separating the final replica into the individual micro-optical or micro-mechanical components, where the lines along which the replica is separated ('dicing streets') are favorably placed on (optically) inactive areas of the framework (i.e. are along the frames or borders of the framework or possibly along other areas where there are no relevant microstructures). The fabrication process may comprise additional steps in the chain of steps, such as applying release layers, etc.

Figure 5:
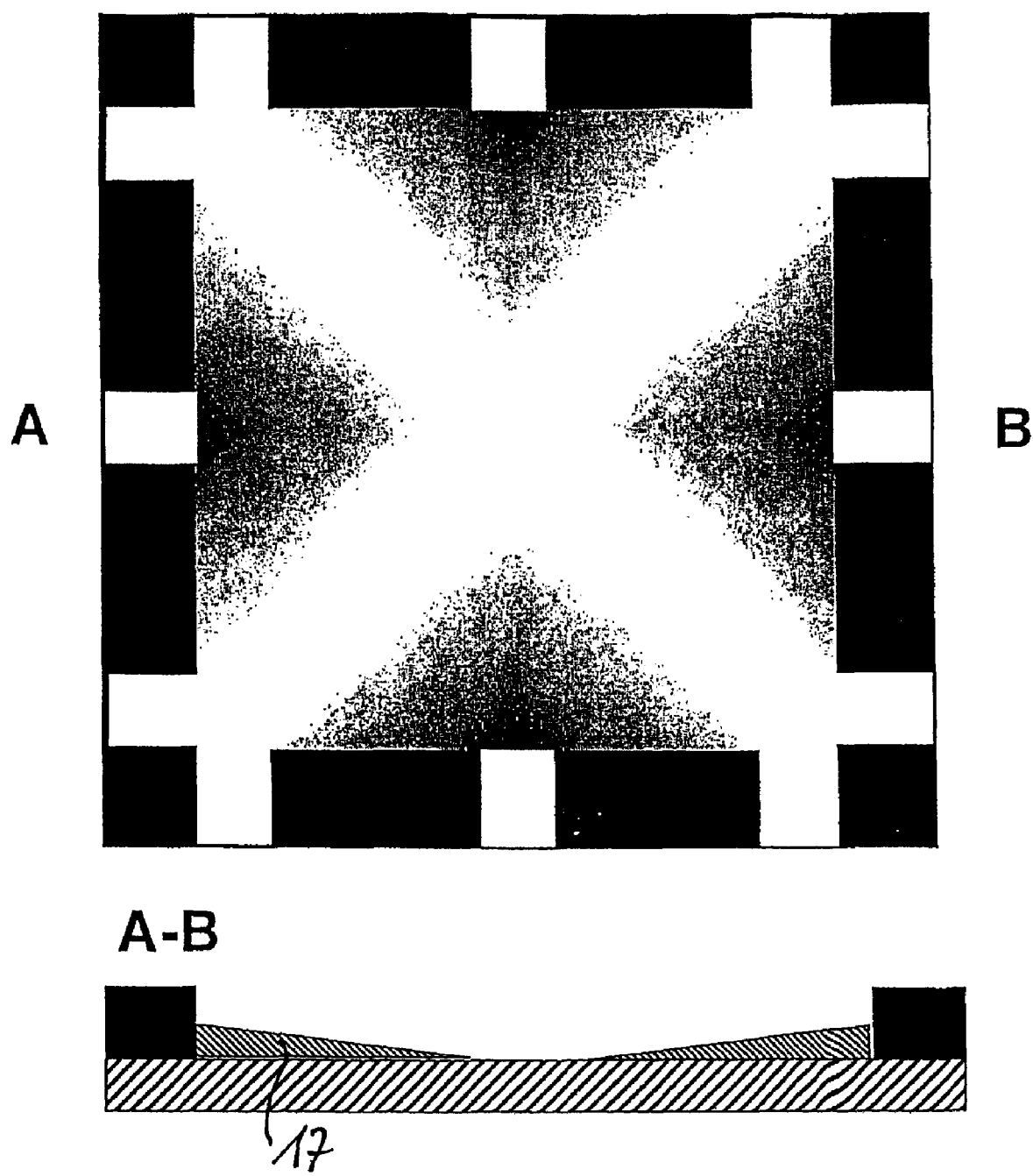
FIG. 5 shows an example of a cell with a 3D structured bottom.

In a special embodiment, the design of the troughs can be further optimized to increase the cell packing density of the wafer. Troughs with round or polygonal boundaries can be applied in order to minimize the inclusion of air bubbles in the replication process (by being better adapted to the flow characteristics of a liquid replication material) and also contribute to a more tight packing arrangement. FIG. 5 shows an example of a cell with a rectangular trough. For example, a 3-D structure 17 forming the troughs' bottom can be used to optimize the flow of the fluid or plastically deformable material during the embossing step and to minimize the amount of unneeded epoxy that collects in certain areas. In the upper panel of FIG. 5, the relief of the 3D structure is indicated by different brightnesses, dark regions corresponding to areas where the structure is higher. The lower panel shows a cut along the line A-B of the upper panel.

This type of recombination framework requires less free space around the individual cells and therefore helps to increase the number of recombined cells per wafer. The 3D structure may for example be such that material flow from a center into the edges of troughs (for example being rectangular troughs) is expedited and material flow into channels nearer to center of the trough is inhibited, as is in the cross-like conduit structure of FIG. 5. The 3D structure may also be such that depressions lead, in a conduit-like manner, to channels in the lattice.

More in general, the structure of the trough may be designed in such a way that the excess material in the recombination process is being taken care of so that a maximum planarity is achieved.

Figure 6:
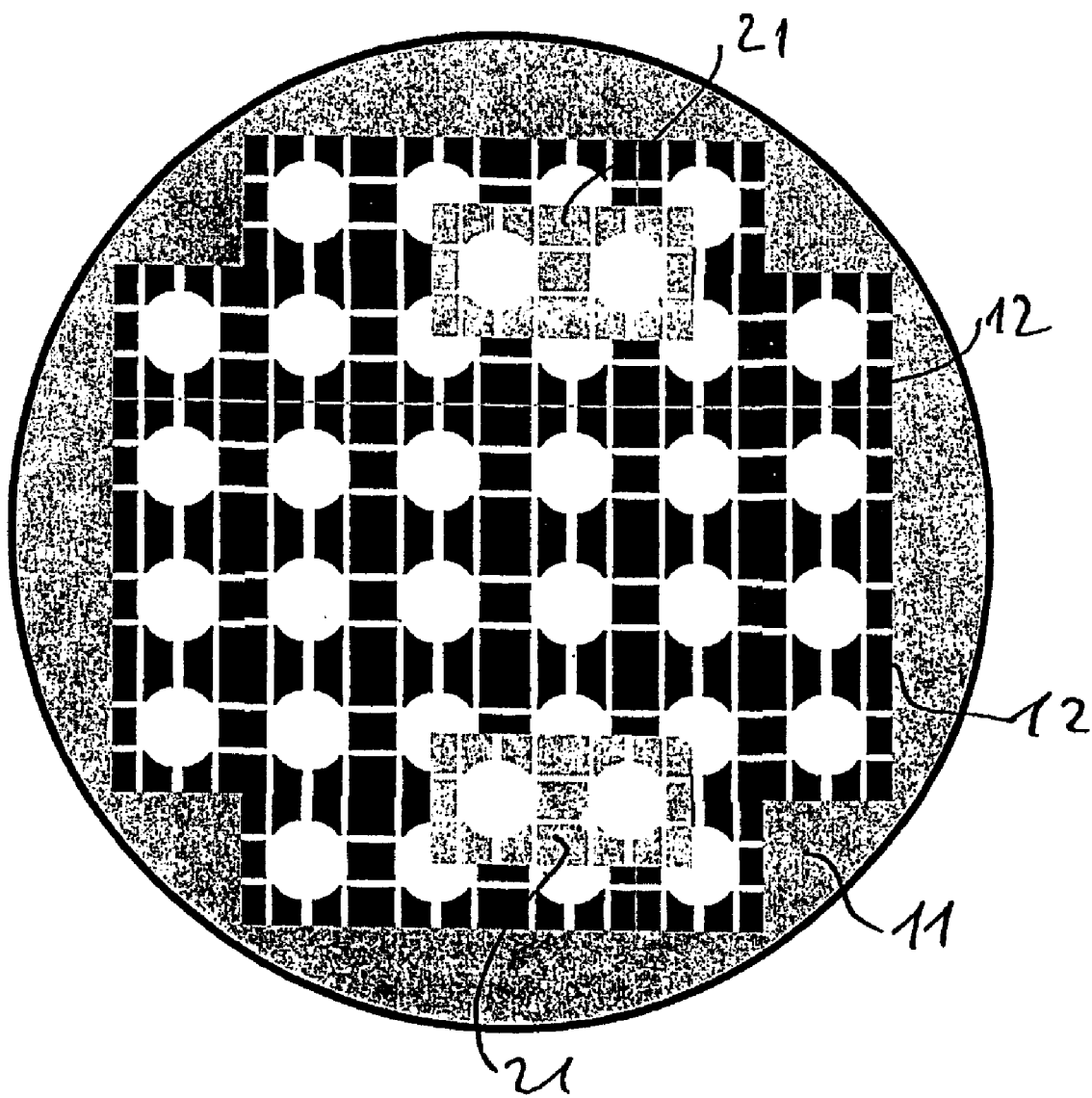
FIG. 6 represents an example of a framework with enhanced trough density.

Another possibility to increase the number of recombined cells on a wafer is very schematically depicted in FIG. 6. This option is available if the thickness of the final replicas does not have to be uniform, i.e. if the micro-optical or micro-mechanical elements to be produced do not need to have the same thickness. The option is to use, on a second level added to the first level framework, a similar framework geometry, but to apply it in a position which is shifted, for example by half a period in x- and y-direction. This can be done either directly on the recombined sub-master, on a protection layer to be subsequently removed from the structures of the first level, or even a further copy in the generation process of the recombined sub-master. Protection layers and/or first level/second level frameworks may be made of different materials, so that they can be selectively removed if required. Depending on the initial framework layout, differently designed frameworks can be used for a second or higher recombination step. In the figure, this principle is schematically illustrated by a second recombination framework 21 on top of the first recombination framework 12.

Now, a further embodiment of the recombination process is shortly described.

Figure 11:
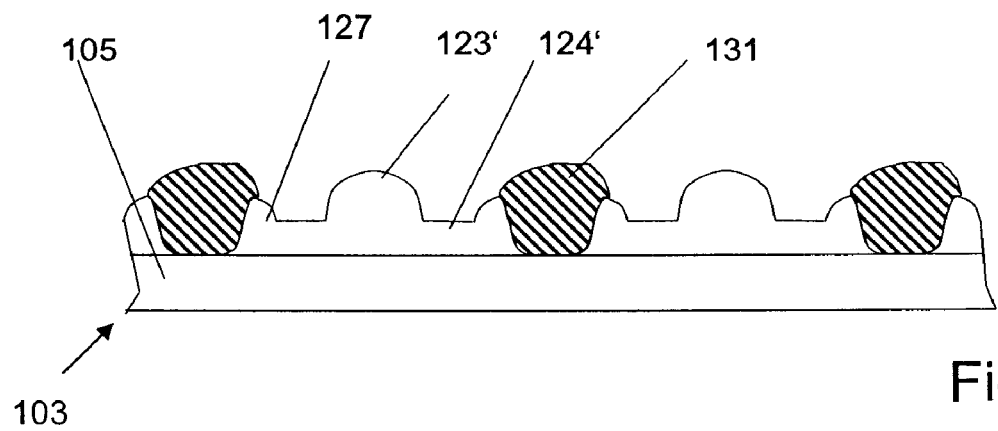
FIG. 11 shows an alternative embodiment of the recombination step in a method according to the first aspect of the invention.

FIG. 11 shows a very schematic example of a disk-shaped substrate 105 of a sub-master 103 after recombination without a recombination framework as above-described. On the substrate, a plurality of replication material portions 104 is shown, each comprising the inverse of a replication section 123' (a portion which comprises a copy of the structures which are finally to provide the optical functionality, also called 'optical structures') and of a spacer portion 124' surrounding it. The remaining material 127 around the spacer portion has an undefined shape and height.

Between the replication material portions 104, a gap 129 remains, where the substrate is not covered by replication material. In accordance with an embodiment of the invention, the at least one gap is now filled before the sub-master is used in the next replication step to cast a tool from it.

The spacer portion of a replication tool is a portion that protrudes above the replication sections of the tool. At least some of the spacer portions may, during replication, abut the substrate. In addition or as an alternative, at least some of the spacer portions may be 'floating', i.e. a thin base layer of replication material may remain between the spacer portions and the substrate during final replication. The purpose of the spacer portions is one or a combination of the following:

The spacer portions precisely determine a reference height of the replicated structures above the substrate.

The spacer portions may absorb at least part of the force between the tool and substrate during replication.

The spacer portions also allow the tool to adapt to irregularities of the planarity of the substrate.

Spacer portions arranged along the dicing lines help to prevent delaminating of the replication material from the substrate.

The substrate 105—also called 'element substrate' in this text, for example has the approximate size and shape of an optical wafer, which latter is used for the final replica. However, in contrast to the optical wafer, the element substrate 105 need not necessarily be transparent.

The filler material 131 fills the entire space between the replication material portions. Its height is greater than the minimal height of the replication material portions at the place of the spacer portion 124'.

In accordance with a first variant, the gap is filled by a plastic material, such as an epoxy. It may be filled by material of the same composition as the replication material.

According to a second variant, the gap may be filled by material of a primarily metallic composition. Especially, the substrate 105 may be metallic or comprise a metallic surface, and the material may be added galvanically, i.e. by electroplating. For example, the filling may be made of nickel or copper added by electroplating.

Other variants of filling the gap may be envisaged.

The thickness of the filler material in the shown, preferred, embodiment is such that it exceeds the thickness of the replication material at the place of the spacer portions 124'. Therefore, the spacer portions of the tool cast from the sub-master protrude further than the portions at positions corresponding to the gap 129.

What is claimed is:

1. In a process of manufacturing optical components, a method of manufacturing an element including a plurality of replicated structures, each replicated structure comprising geometrical features of at least one optical component, the method comprising the steps of:

providing a master or a master tool having a structured surface, performing a first replication step for producing a first stage cast by replication of said master or master tool, performing a second replication step for producing a second stage cast by replication of the first stage cast, performing a third replication step for producing a third stage cast by replication of the second stage cast, wherein the first, second and third replication steps each include replication sub-steps of:

provinding liquid or viscous or plastically deformable material, replicating a structured surface of an element to be replicated in the respective replication step into the liquid or viscous or plastically deformable material, hardening the liquid or viscous or plastically deformable material to form a structured surface of an element produced in the respective replication step, wherein at least one of said first and second replication steps is a recombination step, wherein an element to be replicated in the recombination step has a structured surface having a first surface area, and wherein the recombination step includes recombination sub-steps of:

providing a substrate having a substrate surface having a second surface area, said second surface area being at least a multiple of said first surface area, replicating said structured surface of said element to be replicated in the recombination step into a first portion of liquid or viscous or plastically deformable material disposed at a first place on said substrate surface, hardening said first portion of the liquid or viscous or plastically deformable material, removing said element to be replicated in the recombination step from said first portion of liquid or viscous or plastically deformable material, replicating said structured surface of said element to be replicated in the recombination step into a second portion of liquid or viscous or plastically deformable material at a second place on said substrate surface, hardening said second portion of the liquid or viscous or plastically deformable material, and removing said element to be replicated in the recombination step from said second portion of liquid or viscous or plastically deformable material, whereby an element produced in the recombination stepvcomprises a plurality of replicated structures each being a cast of said structured surface of said element to be replicated in the recombination step wherein in the recombination step, a gap remains between the first portion of the liquid or viscous or plastically deformable material and the second portion of the liquid or viscous or plastically deformable material, wherein in the gap, the substrate surface remains substantially free of liquid or viscous or plastically deformable material, and wherein the recombination step further comprises the recombination sub-step of: subsequently filling the gap between the hardened liquid or viscous or plastically deformable material disposed at the first place and the hardened liquid or viscous or plastically deformable material disposed at the second place with a filler material, wherein in the sub-step of filling the gap, a filler material height is caused to be greater than a minimal height of the liquid or viscous or plastically deformable material disposed at the first place and greater than a minimal height of the hardened liquid or viscous or plastically deformable material disposed at the first place and greater than a minimal height of the hardened liquid or viscous or plastically deformable material disposed at the second place.

2. The method of claim 1, wherein said at least one recombination step further includes the sub-step of providing the substrate with a recombination framework, said recombination framework defining a plurality of troughs framed by said recombination framework, and wherein the liquid or viscous or plastically deformable material is disposed into said troughs.

3. The method according to claim 1, wherein the gap is filled to such an extent that a thickness of the filler material in the clap is greater than a minimal thickness of said element to be replicated in the recombination step.

4. The method of claim 1, further including the step of separating a final replica obtained in said third replication step or by further replication thereof along dicing streets.

5. The method as claimed in claim 1, wherein said substrate is disk-shaped.

6. The method as claimed in claim 2, wherein the recombination framework is lattice-shaped, whereby the troughs form a regular pattern of troughs.

7. The method as claimed in claim 2, wherein the replicating carried out during said recombination step comprises an embossing step, and wherein said recombination framework further comprises a plurality of channels positioned in such a manner that during such an embossing step, air or superfluous material can escape into one of the channels.

8. The method as claimed in claim 2, wherein bottoms of said troughs are not flat but have a three-dimensional structure.

9. The method as claimed in claim 8, wherein the three-dimensional structure further comprises depressions in the recombination framework, for guiding a flow of the liquid or viscous or plastically deformable material during replication.

10. The method as claimed in claim 2, wherein the recombination framework defines a stop face, wherein the element to be replicated in the recombination step abuts said stop face during the replicating step.

11. In a process of manufacturing optical components, a method of manufacturing an element that includes a plurality of replicated structures, each replicated structure comprising geometrical features of at least one optical component, the method comprising the steps of:

providing a substrate, having a planar surface, providing a primary element having a structured surface, replicating said structured surface of said primary element into a first portion of liquid or viscous or plastically deformable material at a first place on said planar surface, hardening said first portion of liquid or viscous or plastically deformable material to yield a first hardened material portion with a replicated surface, removing said primary element from said first portion of liquid or viscous or plastically deformable material, replicating said structured surface of said primary element into a second portion of liquid or viscous or plastically deformable material at a second place on said planar surface, with a gap remaining between the hardened first portion of the liquid or viscous or plastically deformable material and the second portion of liquid or viscous or plastically deformable material, wherein in the gap, the planar surface remains substantially free of the liquid or viscous or plastically deformable material, hardening said second portion of liquid or viscous or plastically deformable material, to yield a second hardened material portion with a replicated surface, removing said element to be replicated from said second portion of liquid or viscous or plastically deformable material, filling the gap with a filler material in a manner that the replicated surfaces of the first and second hardened material portions remain free of the filler material, thereby generating a secondary element comprising:
the substrate,
a plurality of replicated structures, each being a cast of said structured surface, and
the filler material, and
replicating the secondary element with the first and second hardened material portions constituting replication surfaces wherein in the step of filling of filling the gap, a filler material height is caused to be greater than a minimal height of the first and second hardened replication material portions.

12. The method of claim 11, wherein in the step of filling the gap, the filler material is chosen to be a plastic material.

13. The method of claim 11, wherein in the step of filling the gap, the filler material is chosen to be metallic and is added galvanically.

14. The method as claimed in claim 11, wherein said substrate is disk-shaped.

* * * * *